United States Patent [19]
Leung

[11] Patent Number: 5,784,705
[45] Date of Patent: Jul. 21, 1998

[54] METHOD AND STRUCTURE FOR PERFORMING PIPELINE BURST ACCESSES IN A SEMICONDUCTOR MEMORY

[75] Inventor: Wingyu Leung, Cupertino, Calif.

[73] Assignee: MoSys, Incorporated, Sunnyvale, Calif.

[21] Appl. No.: 679,873

[22] Filed: Jul. 15, 1996

[51] Int. Cl.$^6$ ........................................ G11C 7/00
[52] U.S. Cl. ........................ 711/169; 365/189.05
[58] Field of Search ................ 395/496; 365/189.05, 365/233; 711/169

[56] References Cited

U.S. PATENT DOCUMENTS

| | | | |
|---|---|---|---|
| 5,289,584 | 2/1994 | Thorne et al. | 395/436 |
| 5,402,389 | 3/1995 | Flannagan et al. | 365/233 |
| 5,469,558 | 11/1995 | Lieberman et al. | 395/285 |
| 5,502,835 | 3/1996 | Le et al. | 395/496 |
| 5,513,148 | 4/1996 | Zagar | 365/233 |
| 5,519,839 | 5/1996 | Culley et al. | 395/310 |
| 5,519,847 | 5/1996 | Fandrich et al. | 395/496 |
| 5,579,267 | 11/1996 | Koshikawa | 365/189.05 |
| 5,586,282 | 12/1996 | Iino et al. | 395/405 |
| 5,592,435 | 1/1997 | Mills et al. | 365/233.5 |

OTHER PUBLICATIONS

Dosaka et al., "A 100-MHz 4-Mb Cache DRAM with Fast Copy-Back Scheme," IEEE Journal of Solid-State Circuits, vol. 27, No. 11, Nov. 1992, pp. 1534–1539.

Bondurant, David, "15nsec Enhanced DRAM Upgrades System Performance in 72-Pin SIMM Socket," Silicon Valley Personal Computer Design Conference Proceedings (date of publication unknown), pp. 81–86.

Sunaga et al., "A Full bit Prefetch Architecture for Synchronous DRAM's," IEEE Journal of Solid-State Circuits, vol. 30, No. 9, Sep. 1995, pp. 998–1005.

Intel, "Pentium Processor 3.3V Pipelined BSRAM Specification," Ver. 2.0, May 25, 1995, pp. 1–44.

*Primary Examiner*—Tod R. Swann
*Assistant Examiner*—Christopher S. Chow
*Attorney, Agent, or Firm*—Skjerven, Morrill, MacPherson, Franklin, & Friel LLP; Norman R. Klivans

[57] ABSTRACT

A method and structure for implementing pipeline burst read and write operations in a semiconductor memory having a memory cycle time substantially longer than its I/O data cycle-time. The memory system includes a read buffer which stores all data required for a read burst transaction. All read burst data is loaded from the memory to the read buffer at the beginning of each burst read access. The memory is then isolated from the read buffer and prepared to perform the next burst access. During this time, the read data values are provided to the I/O device from the read buffer. A double-buffering technique provides gap-less output data for consecutive pipeline-burst read transactions. The memory system uses a two-entry write buffer in a first in, first out manner for pipeline-burst write operations. Each write buffer entry stores data for an entire burst transaction and a corresponding address. The first entry stores the data and address for a current write transaction and the second entry stores the data and address for a previous write transaction. The first and second entries are isolated to allow the second entry to provide its data and address to the memory while the first entry stores its corresponding data and address. A high-bandwidth transfer rate between the second entry and the memory with time to prepare the memory for the next transaction.

28 Claims, 11 Drawing Sheets

METHOD AND STRUCTURE FOR PERFORMING PIPELINE BURST ACCESSES IN A SEMICONDUCTOR MEMORY

RELATED APPLICATIONS

The present application is related to commonly owned U.S. patent application Ser. No. 08/522,032, entitled "Method and Structure for Controlling Internal Operations of a DRAM Array", by Wingyu Leung, filed Aug. 31, 1995, now U.S. Pat. No. 5,615,169 issued Mar. 25, 1997, which is hereby incorporated by reference in its entirety.

BACKGROUND OF THE INVENTION

1. Field of the Invention

The present invention relates to a method and structure for enabling pipeline burst read and write accesses to a semiconductor memory having a memory cycle time which is longer than its input/output (I/O) data cycle time, and an internal data transfer rate which is higher than its required I/O data rate.

2. Description of the Prior Art

As the data processing power of microprocessors increases, the bandwidth requirements for semiconductor memory devices used with these microprocessors also increases. Because most data requested in a data processing system is sequential in nature, burst accesses are used by many data processing systems to boost the I/O data bandwidth between the memory and the microprocessor. In a typical burst access, the desired row of the memory is accessed, followed by a plurality of sequential column accesses, such that a plurality of data values are written to or read from the accessed row of the memory.

Many data processing systems also increase the data transfer efficiency between the microprocessor and the memory by performing pipeline accessing. In pipeline transactions, while data from the current transaction is being transferred, the address processing associated with the next transaction is being performed in parallel. That is, the memory operation for the pipeline transaction is carried out in parallel with data I/O operations for the current transaction. It is desirable to have a semiconductor memory which can support both pipeline and burst accesses (hereinafter referred to as pipeline-burst accesses).

Static random access memory (SRAM) has been designed to support pipeline-burst accesses. One such SRAM device is described in "Pentium Processor 3.3V Pipelined BSRAM Specification", version 2.0, Intel Corporation, May 25, 1995. Because SRAM devices have a relatively fast memory cycle time, the SRAM device can be designed such that the memory cycle time is equal to the I/O cycle time. Memory cycle time is defined as the time required for data to be written to (or read from) the memory cells of a memory device after a memory access has been initiated. For a read operation, the memory cycle time includes the time required for all or part of the address decoding, signal development at the bit lines, data sensing, and transferring data to the output register. For a write operation, the memory cycle time includes the time required for all or part of the address decoding, transferring data from the input register to the bit lines, and transferring data from the bit lines to the memory cells. I/O cycle time is defined as the time required to read (or write) a quanta of data (e.g., 32-bits) from (or to) a memory device which has already been addressed.

SRAM cells are much larger (~4 times larger) and more expensive than dynamic random access memory (DRAM) cells. It would therefore be desirable to have a DRAM memory device that is capable of handling pipeline-burst accesses at the same I/O operating frequency as an SRAM device. However, DRAM has a relatively long memory cycle time compared to its I/O cycle time. Consequently, the implementation of pipeline-burst DRAM memory is necessarily different from the implementation of pipeline-burst SRAM memory. Existing synchronous DRAM (SDRAM) can support pipeline-burst operation as long as the data values to be read (or written) are stored in the same page of the SDRAM or in different SDRAM banks. When the addresses of the data values of a pipeline-burst operation are located in different pages of the same SDRAM bank (i.e., when bank conflict exists), pipelining cannot be implemented. Instead, each transaction must be completed and the bit lines and sense amplifiers must be pre-charged before the next transaction is processed. SDRAM is therefore undesirable for applications which require a uniform pipeline burst access across the entire address range spanned by the memory.

Certain DRAM devices, such as those described in "15 nsec Enhanced DRAM Upgrades System Performance in 72-pin SIMM Socket" by David W. Bondurant and "A 100 MHz 4_Mb Cache DRAM with Fast Copy-Back Scheme" by K. Dosaka et al., IEEE JSSC vol. 27, no. 11, pp. 1534–1539, employ write buffers. However, the write-buffers in these devices cannot handle pipeline write accesses.

Certain other DRAM devices, such as the device described in "A Full Bit Prefetch Architecture for Synchronous DRAM's" by T. Sunaga et al., IEEE JSSC, vol. 30, pp. 998–1005, 1995, employ a prefetch read buffer to handle pipeline-burst read accesses. In this device, the prefetch buffer capacity is designed to store data for eight I/O cycles, or one memory cycle of the device, rather than the maximum burst length of a transaction. Data stored in the prefetch buffer must be transmitted to a subsequent pipeline stage before reaching the output driver. The additional pipeline stage is required to allow output data values to be provided without a gap between consecutive burst transactions. However, the additional pipeline stage increases the read access latency by one clock cycle. For write accesses, this device behaves like an SDRAM and therefore cannot handle pipelined transactions when a bank conflict exists.

It would therefore be desirable to have a memory system which overcomes the previously described shortcomings of the prior art. More specifically, it would be desirable to have a DRAM memory system which is capable of performing read and write pipeline burst operations with a minimum and uniform access latency over the entire address range of the DRAM memory system.

SUMMARY

Accordingly, the present invention provides a method and structure for implementing pipeline-burst read and write operations in a semiconductor memory having a memory cycle time substantially longer than its I/O data cycle-time. To facilitate a pipeline-burst read operation, the memory system incorporates a read buffer capable of storing all of the data values required for a burst transaction. Taking advantage of the high bandwidth data transfer between the memory and the read buffer, all of the data values required for the burst transaction are loaded from the memory to the read buffer at the beginning of each burst read access. The memory is then isolated from the read buffer and prepared to perform the next burst access. During this time, all of the read data values are provided to the I/O device from the read buffer. The read buffer thus isolates the memory from the I/O device and allows parallel memory and I/O operations. A double-buffering technique is used to obtain gap-less transition in the output data from consecutive pipeline-burst read transactions.

To facilitate pipeline-burst write operations, the memory system uses a two-entry write buffer which is operated in a first in, first out (FIFO) manner. Each write buffer entry contains two fields: a data field which stores data for an entire burst transaction, and an address field which stores an address corresponding to the data stored in the data buffer. During write transactions, the first entry is used to store the data and address for a current write transaction. The second entry stores previously written data and addresses which are retired to the memory. Upon the initiation of a write transaction, the address of the entry to be retired is sent to the memory so that the data from the previous transaction can be written to the designated locations in the memory. At the same time, the data and address of the current write transaction is latched into the address field of the first entry. By taking advantage of the high-bandwidth internal transfer between the write buffer and the memory, data retiring can be performed much faster than an I/O burst transaction, thereby allowing time to prepare the memory for the next transaction. The write buffer thus isolates the memory array from the I/O device and allows parallel memory and I/O device operations. The read and write buffers decouple the memory from the I/O device and bridge the difference between the memory cycle time and the I/O cycle time seamlessly so that the memory system has a fixed access latency independent of page hit, page miss and bank conflict during pipeline burst accesses. A sequencer is incorporated to generate row and column access signals in synchronism with an input clock signal upon detecting an external access signal which indicates a new transaction.

The present invention will be more fully understood in view of the following detailed description taken together with the drawings.

DETAILED DESCRIPTION

Figure 1:
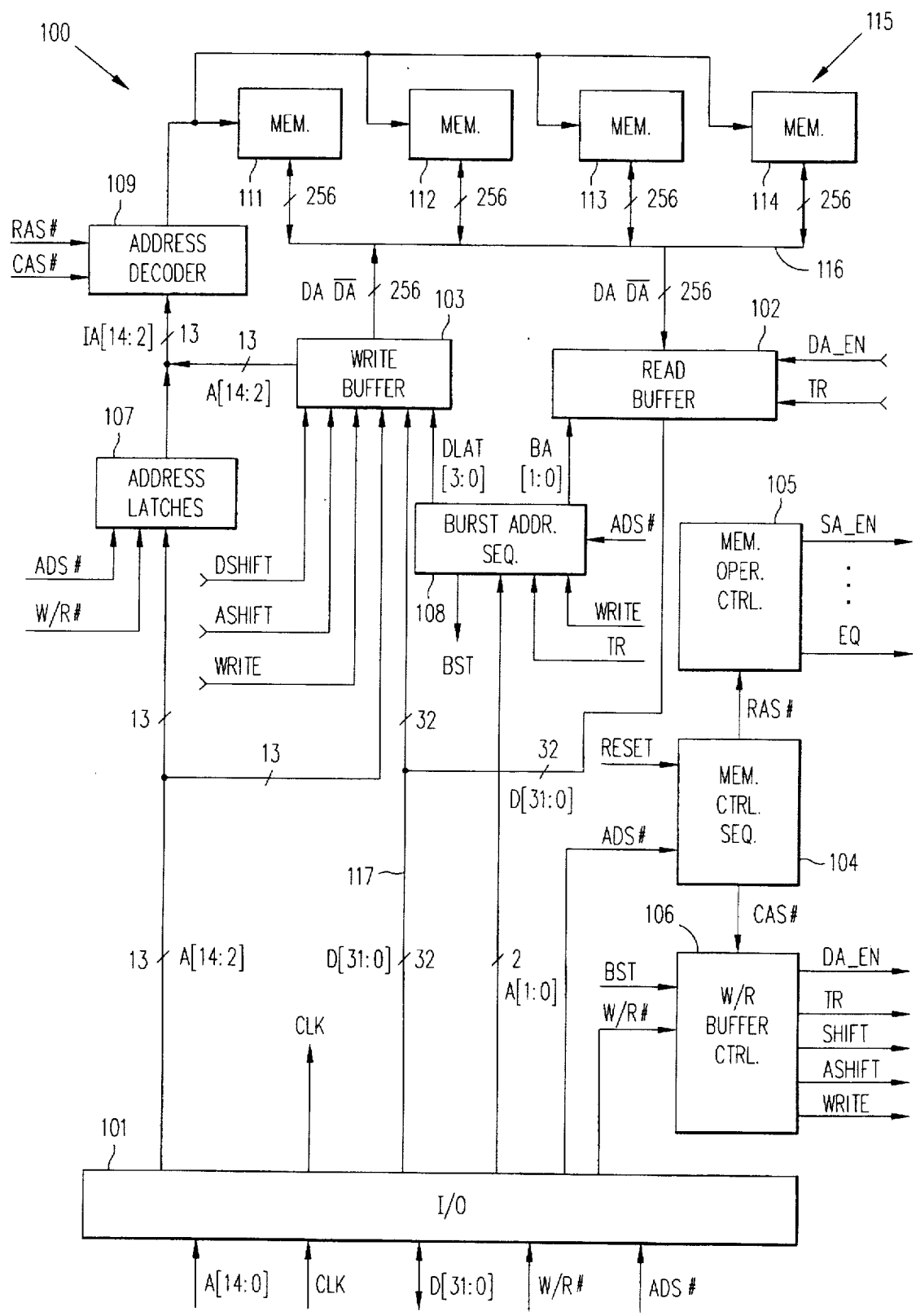
FIG. 1 is a block diagram of a pipeline-burst DRAM (PBDRAM) system in accordance with one embodiment of the present invention.

FIG. 1 is a block diagram of a pipeline-burst DRAM (PBDRAM) system 100 in accordance with one embodiment of the present invention. PBDRAM system 100 includes I/O device 101, read buffer 102, write buffer 103, memory control sequencer 104, memory operation control circuit 105, write/read buffer control circuit 106, address decoder and latch circuit 107, burst address sequencer 108, address decoder 109 and memory banks 111–114. Memory banks 111–114 are collectively referred to as memory array 115. In the described embodiment, the elements of memory system 100 are fabricated on a single chip.

Each of memory banks 111–114 includes an array of DRAM memory cells having 256 rows and 1024 columns. Each of memory banks 111–114 stores up to 32K words, with 32 bits in each word. Each of memory banks 111–114 further includes a plurality of sense amplifiers, with one sense amplifier coupled to each column of memory cells, and a plurality of word line drivers, with one word line driver coupled to each row of memory cells (i.e., word line). Within each of memory banks 111–114, the sense amplifiers are arranged into groups of eight and connected through 8-to-1 column switches (multiplexers) to 128 pairs of data lines. The column switches, in their off-state, isolate the sense-amplifiers from the data lines. The 128 pairs of data lines form a data bus 116 which is connected in parallel to DRAM banks 111–114, read buffer 102 and write buffer 103.

I/O device is coupled to an external device, such as a microprocessor, to receive a 32-bit data value D[31:0], a 15-bit address signal A[14:0], a clock signal CLK, a write/read indicator signal W/R#, an address strobe signal ADS#, and a reset signal RESET. I/O device 101 is coupled to read buffer 102 and to write buffer 103 by a 32-bit wide data bus 117 which carries the 32-bit data values D[31:0]. I/O device 101 also provides the upper 13 address bits A[14:2] to address latch circuit 107 and to write buffer 103. The lower 2 address bits A[1:0] are provided to burst address sequencer 108. As described in more detail below, address bits A[14:2] are used to address memory banks 111–114, and address bits A[1:0] are used to control the sequence of the data values in a burst operation.

I/O device 101 also provides the address strobe signal ADS#, clock signal CLK and reset signal RESET to memory control sequencer 104. Because the clock signal CLK is provided to most of the elements of memory system 100, for purposes of clarity, the clock signal CLK is not illustrated as entering the various elements of memory system 100. Instead, the clock signal CLK is illustrated as leaving I/O device 101, with the understanding that this clock signal CLK is provided to the elements of memory system 100 as required. In response to the received signals, memory control sequencer 104 generates a row access (RAS#) signal and a column access (CAS#) signal. The RAS# and CAS# signals are provided to memory banks 111–114 (not shown). In addition, the RAS# signal is provided to memory operation control circuit 105, and the CAS# signal is provided to write/read buffer control circuit 106.

In response to the RAS# signal, memory operation control circuit 105 generates signals to enable the sense amplifiers and to equalize the bit lines within memory banks 111–114. The operation of memory control circuit 105 is described in more detail in commonly-owned, U.S. patent application Ser. No. 08/522,032, now U.S. Pat. No. 5,615,169, which is hereby incorporated by reference in its entirety.

In response to the CAS# signal, write/read buffer control circuit 106 generates a set of read control signals or a set of write control signals, depending on whether I/O device 101 is performing a read operation or a write operation as determined by the W/R# signal. Write/read buffer control circuit 106 receives the W/R# signal from I/O device 101. The state of the W/R# signal indicates whether I/O device 101 is initiating a read or a write transaction. A logic high W/R# signal indicates a write transaction, while a logic low W/R# signal indicates a read transaction. When I/O device 101 is initiating a read transaction, write/read buffer control circuit 106 generates a data amplifier enable (DA_EN) signal and a transfer enable (TR) signal to control read buffer 102. Alternatively, when I/O device 101 is initiating a write transaction, write/read buffer control circuit 106 generates a data shift (DSHIFT) signal, an address shift (ASHIFT) signal and a write (WRITE) signal for controlling write buffer 103. These read and write transactions are described in more detail below.

Figure 2:
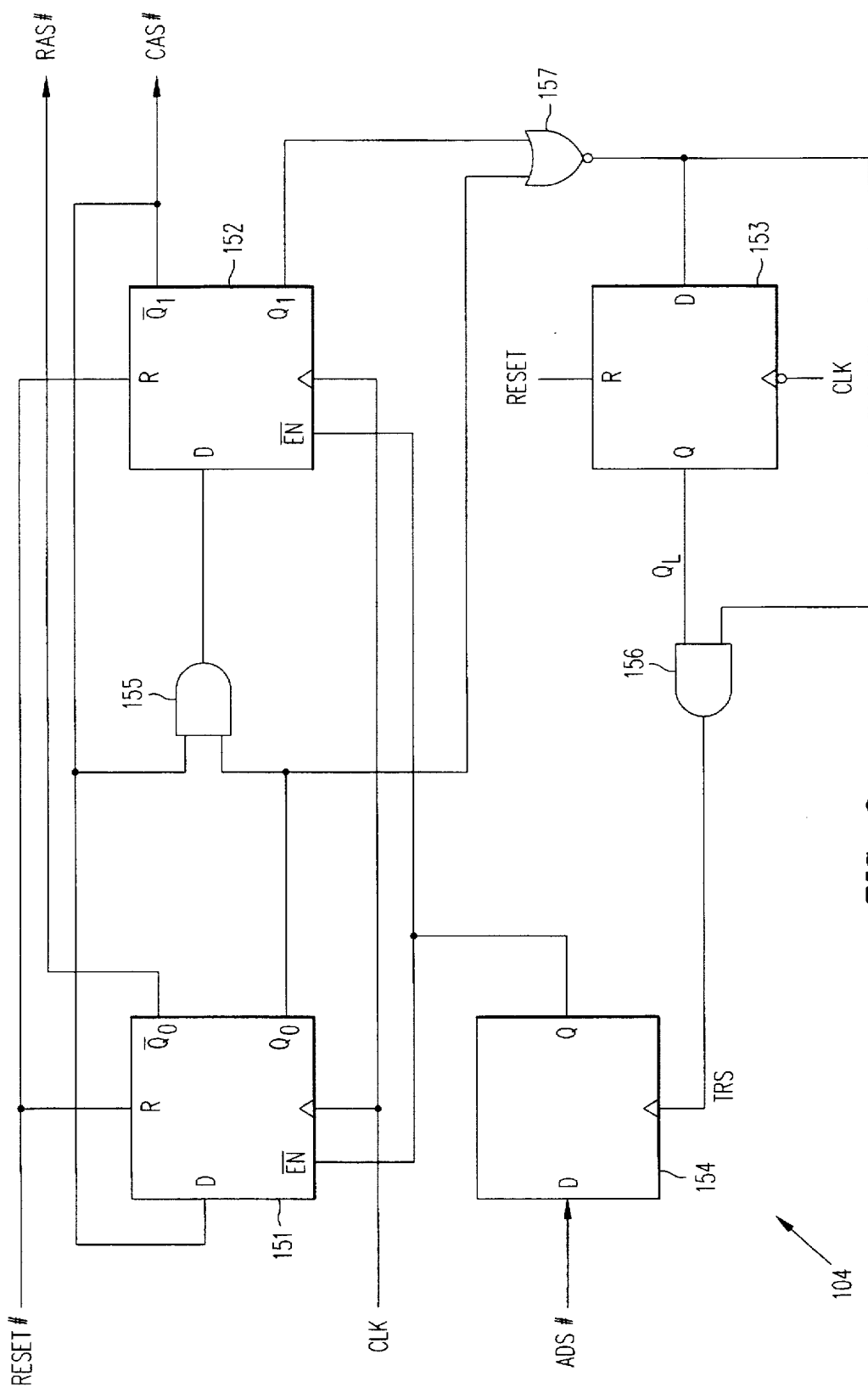
FIG. 2 is a block diagram of memory control sequencer in accordance with one embodiment of the invention.

FIG. 2 is a block diagram of memory control sequencer 104 in accordance with one embodiment of the invention. Memory control sequencer 104 includes flip-flops 151–154, AND gates 155–156 and NOR gate 157, which are connected as illustrated. Memory control sequencer 104 generates the RAS# and CAS# signals, which are used to control memory banks 111–114, in response to the ADS#, CLK and RESET signals received from I/O device 101. The RAS# and CAS# signals perform the same functions as conventional row access and column access signals in a conventional DRAM circuit. However, in a conventional DRAM circuit, the row and column access signals are generated off-chip.

The RAS# signal is provided to memory operation control circuit 105. In response, memory operation control circuit 105 generates signals to control the following micro-operations within memory arrays 111–114: word line turn-on, sense-amplifier turn-on, column switch turn-on and bit-line equalization. Memory operation control circuit 105 is described in more detail in commonly owned, U.S. patent application Ser. No. 08/522,032, now U.S. Pat. No. 5,615, 169, which is hereby incorporated by reference in its entirety.

D-type flip-flops 151 and 152 of memory control sequencer 104 are connected to form a modulo 3 counter which provides output signals Q1, $\overline{Q1}$, Q0, and $\overline{Q0}$. The output signals Q1, Q0 of this counter count through the sequence: 00, 01, 11. The output signals $\overline{Q0}$ and $\overline{Q1}$, are used as the RAS# and CAS# signals, respectively.

Figure 3:
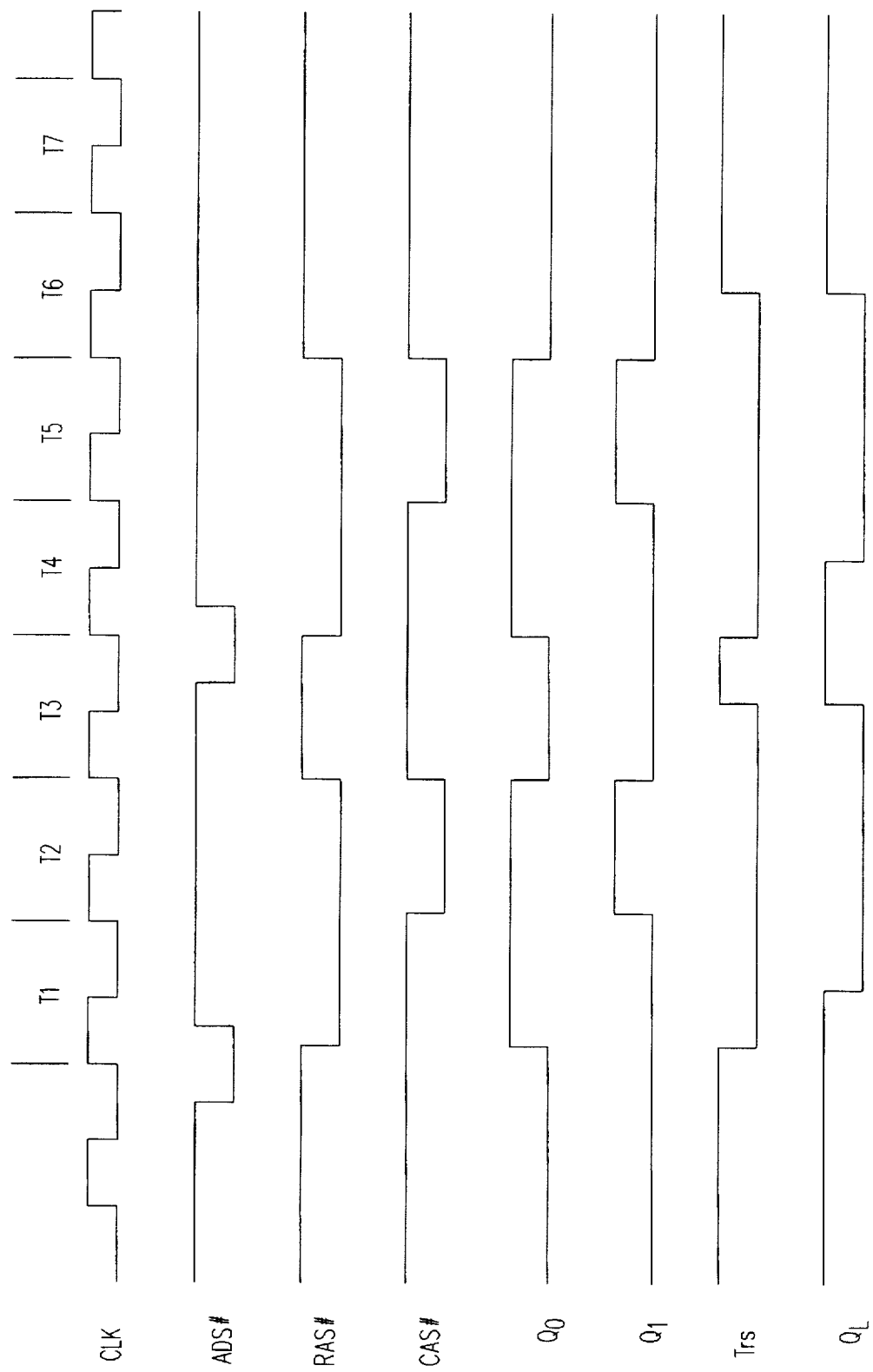
FIG. 3 is a timing diagram illustrating the operation of the memory control sequencer of FIG. 2.

FIG. 3 is a timing diagram illustrating the operation of memory control sequencer 104. Prior to clock cycle T1, when no memory access is detected, memory control sequencer 104 is in the idle state "00", and the RAS# and CAS# signals are de-asserted high. In addition, the transmit (Trs) signal provided by AND gate 156 and the QL signal provided by flip-flop 153 are in logic high states. To initiate a memory access, I/O circuit 101 asserts the ADS# signal by forcing this signal to a logic low state. The ADS# signal is provided to the D input of flip flop 154. The logic high Trs signal provided to flip flop 154 enables the logic low ADS# signal to be passed to the Q output terminal of flip flop 154. The logic low ADS# signal is thereby provided to the enable (EN) input terminals of flip flops 151 and 152, thereby enabling these flip flops 151–152 and initiating the counter formed by flip flops 151–152. At the rising edge of clock cycle T1, sequencer 104 enters the "01" state because the logic high CAS# signal, which is provided to the D input of flip flop 151, is latched into flip flop 151. As a result, the Q0 output signal transitions to a logic high state and the RAS# signal (i.e., the $\overline{Q0}$ signal) transitions to a logic low state, thereby asserting the RAS# signal. The logic high Q0 output signal causes the output signals provided by NOR gate 157 and AND gate 156 to transition to logic low states. The logic low Trs signal provided by AND gate 156 prevents subsequent ADS# signals from being latched into flip flop 154 until the current memory access is completed. At the falling edge of clock cycle T1, flip flop 153 latches the logic low signal provided by NOR gate 157, thereby causing the QL signal to transition to a logic low state.

The logic low RAS# signal is provided to memory operation control circuit 105. In response, memory operation control circuit 104 causes memory banks 111–114 to start a RAS cycle. The logic low RAS# signal is also provided to address decoder 109. In response, address decoder 109 decodes the bank address bits A[14:13] to select one of four memory banks 111–114, and decodes the row address bits A[12:5] to select one of the 256 rows within the selected bank. The word line of the selected row in the selected bank is asserted high. During the falling edge of clock cycle T1, the sense amplifiers of the selected bank are enabled by memory operation control circuit 105.

At the rising edge of the next clock cycle T2, memory control sequencer 104 transitions to the "11" state as follows. The output of AND gate 155 is at a logic high state because of the logic high states of the CAS# and Q0 signals. At the rising edge of clock cycle T2, the logic high output of AND gate 155 is latched into flip flop 152, thereby causing the Q1 output signal to transition to a logic high level and the CAS# signal (i.e., the $\overline{Q1}$ signal) to transition to a logic low level. That is, the CAS# signal is asserted low. The RAS# signal also remains asserted low at this time.

The logic low CAS# signal is provided to memory banks 111–114. In response, memory banks 111–114 start a CAS cycle. During this cycle, the column address bits A[4:2] are decoded to select one of the eight 128-bit word locations within the selected bank, and the column switches associated with this word location are enabled.

The logic low CAS# signal is also provided to write/read buffer control circuit 106. As described in more detail below, in response to the CAS# signal, write/read buffer control circuit 106 generates signals which are used to control read buffer 102 or write buffer 103.

At the rising edge of the next clock cycle T3, memory control sequencer 104 transitions back to the "00" idle state as follows. The logic low CAS# signal causes the input signals to both of flip flops 151 and 152 to be logic low values. The rising edge of clock cycle T3 causes these logic low values to be latched into flip flops 151 and 152, thereby causing the Q0 and Q1 signals to transition to logic low states and the RAS# and CAS# signals to transition to logic high states. The logic low Q0 and Q1 signals, in turn, cause the output signal of NOR gate 157 to transition to a logic high level. The logic high output signal provided by NOR gate 157 is latched into flip flop 153 at the falling edge of clock cycle T3. As a result, the QL and Trs signals transition to logic high states, thereby enabling flip flop 154 to latch a When the RAS# signal is de-asserted high, memory operation control circuit 105 initiates a precharge operation for the selected bank. First, the column switches are turned off. The asserted word line is then turned off. The sense amplifiers are then disabled and equalization of the bit lines are performed. The precharge operation takes approximately one clock cycle (e.g., the duration of clock cycle T3).

Figure 4:
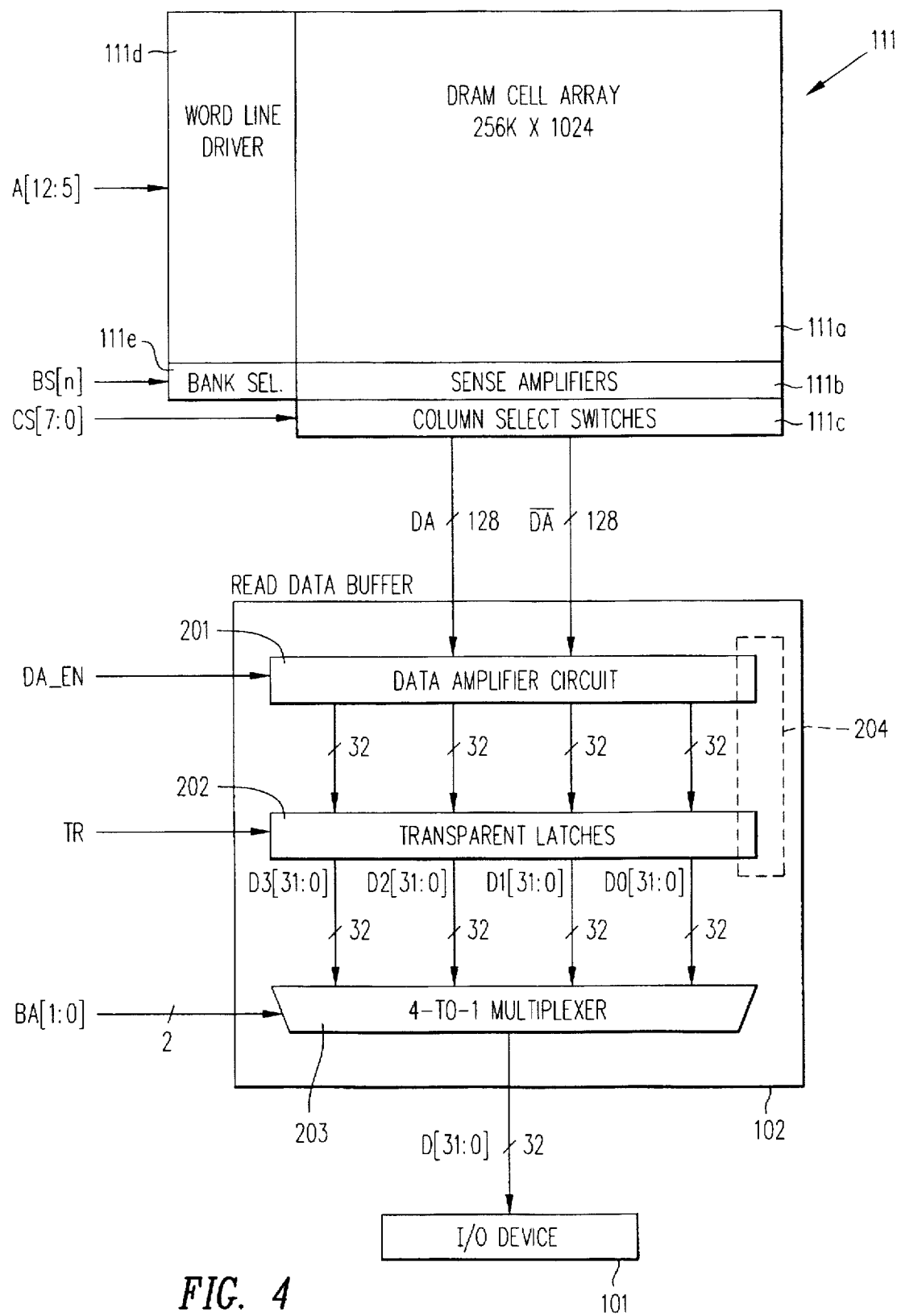
FIG. 4 is a block diagram illustrating a memory bank, a read buffer, and an I/O device in accordance with one embodiment of the invention.

FIG. 4 is a block diagram illustrating memory bank 111, read buffer 102 and I/O device 101. Memory bank 111 includes a 256×1024 array of DRAM memory cells 111a, 1024 sense amplifiers 111b, 128 8-to-1 column select switches 111c, word line driver circuit 111d and bank select circuit 111e. Bank select circuit 111e enables memory bank 111 when the bank select signal BS[n] is asserted high. The BS[n] is one of four output signals BS[3:0] provided by address decoder circuit 109 in response to bank address bits A[14:13]. Word line driver circuit 111d enables one of the 256 word lines in response to the row address bits A[12:5] and the BS[n] signal. One of the eight groups of 128 column switches in circuit 111c is turned on in response to a column select signal CS[7:0], the BS[n] signal and the CAS# signal. The column select CS[7:0] signal is provided by address decoder circuit 109 in response to column select address bits A[4:2]. As a result, four 32-bit data words, represented by data signals DA[127:0] and complementary data signals $\overline{DA}$[127:0], are provided to read data buffer 102. Memory banks 112–114 are substantially identical to memory bank 111.

Read data buffer 102 has the capacity to store the 128 bits of data provided by column select switches 111c. Thus, read data buffer 102 is capable of storing all of the data required for a burst transaction involving four 32-bit words in which one word is output per clock cycle. Read data buffer 102 includes data amplifier circuit 201, transparent latch circuit 202 and 4-to-1 multiplexer 203.

Data amplifier circuit 201 includes 128 data amplifiers, each coupled to receive a corresponding pair of bits from data signal DA[127:0] and complementary data signal $\overline{DA}$[127:0]. A DA_EN signal generated by write/read buffer control circuit 106 enables data amplifier circuit 201. In response, data amplifier circuit 201 generates 128 data values representative of four 32-bit words D0[31:0], D1[31:0], D2[31:0] and D3[31:0].

Transparent latch circuit 202 includes 128 data latches, each coupled to receive one of the 128 data values provided by data amplifier circuit 201. Transparent latch circuit 202 is enabled by a transfer enable signal TR which is generated by write/read buffer control circuit 106, thereby causing the four 32-bit words D0[31:0], D1[31:0], D2[31:0] and D3[31:0], to be latched into transparent latch circuit 202. Four-to-one multiplexer 203 then sequentially routes these 32-bit words from transparent latch circuit 202 to I/O device 101 in response to a burst access signal BA[1:0] generated by burst access sequencer 108. Burst access sequencer 108 generates the burst access signals BA[1:0] in response to address signals A[1:0]. The predesignated burst sequence can be in linear or Intel X86 order.

Figure 5:
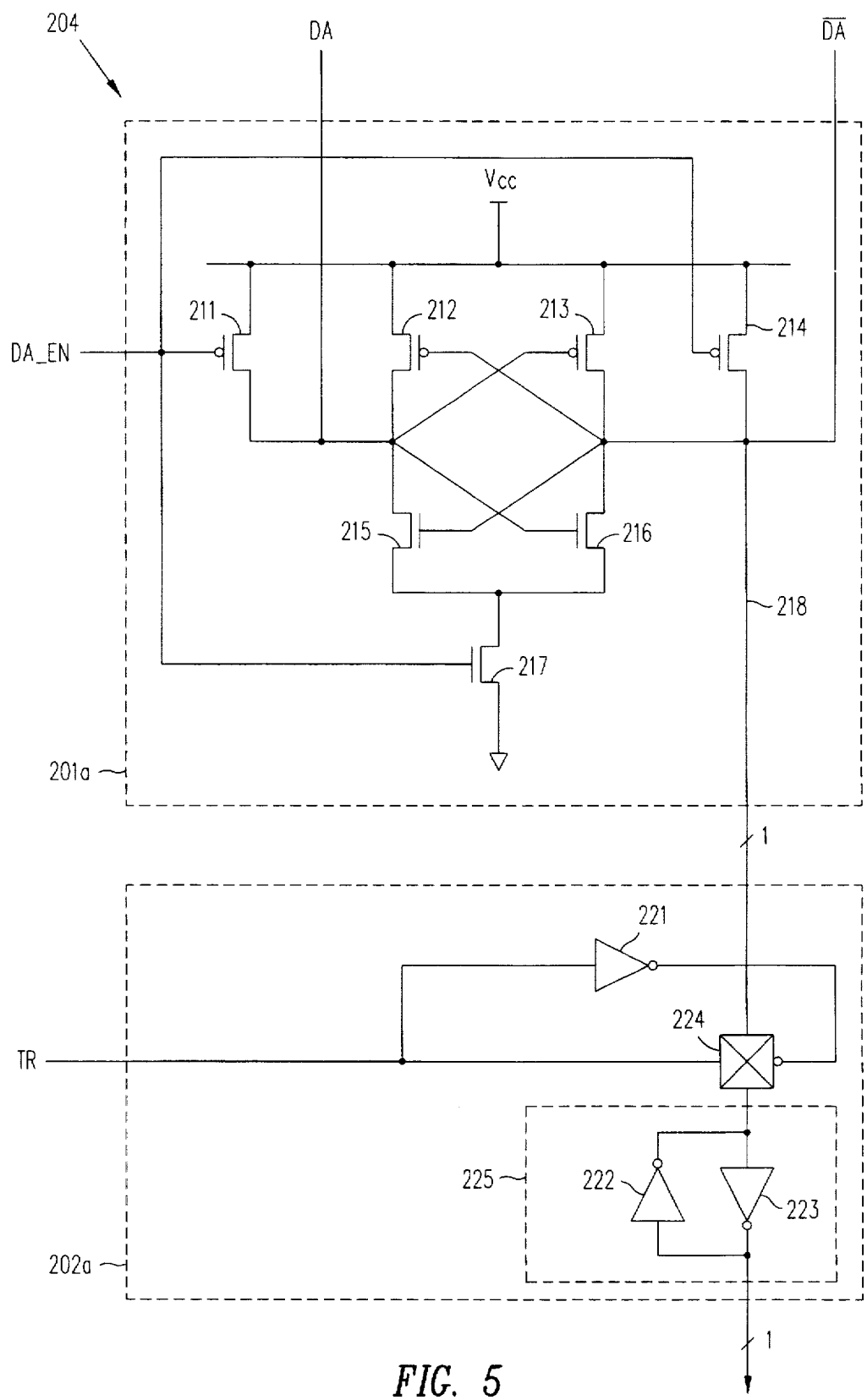
FIG. 5 is a schematic diagram illustrating a bit-slice of the read buffer of FIG. 4.

FIG. 5 is a schematic diagram illustrating a bit-slice 204 of read buffer 102. Bit-slice 204 includes data amplifier 201a and transparent latch 202a. Data amplifier 201a includes p-channel transistors 211–214 and n-channel transistors 215–217. P-channel transistors 212–213 and n-channel transistors 215–216 are cross-coupled to form a regenerative latch circuit. This regenerative latch is enabled and disabled by the DA_EN signal provided to p-channel transistors 211 and 214 and n-channel transistor 217. When enabled by a logic high DA_EN signal, the regenerative latch amplifies and stores the DA and $\overline{DA}$ signals present on the pair of data lines connected to data amplifier 201a. The amplified $\overline{DA}$ signal is provided to transparent latch 202a on line 218.

Transmission gate 224 of transparent latch 202a is connected to line 218 to receive the amplified $\overline{DA}$ signal from data amplifier 201a. Transmission gate 224 is controlled by the transfer enable signal TR (and the inverse of the transfer enable signal as created by inverter 221). The transfer enable signal TR is received from write/read buffer control circuit 106. When the transfer enable signal TR is high, transmission gate 224 is turned on and the amplified data signal $\overline{DA}$ is transferred to the transparent latch 225 formed by inverters 222 and 223. When the transfer enable signal TR is low, the transparent latch 225 is isolated from data amplifier 201a. After transparent latch 225 has been isolated from data amplifier 201a, transparent latch 225 stores a data bit corresponding to a current read transaction. At this time, data values for the next (pipelined) read transaction can be stored in data amplifier circuit 201.

After all of the data values stored in transparent latch circuit 202 have been provided to I/O circuit 101, the transfer enable signal TR is pulsed high for one clock cycle, thereby causing the data values for the next read transaction stored in data amplifier 201a to flow directly from data amplifier 201a through transparent latch 202a to I/O circuit 101. The data amplifier 201a and the transparent latch 202a thus are configured as a double buffer which allows data to be provided without a gap between data values of a current read transaction to data values of the next (pipelined) read transaction. The flow-through mechanism which exists between the data amplifier circuit 201 and the I/O device 101 eliminates the necessity of a pipeline-stage and the associated increase in read access latency which would be introduced by such a pipeline-stage.

Figure 6:
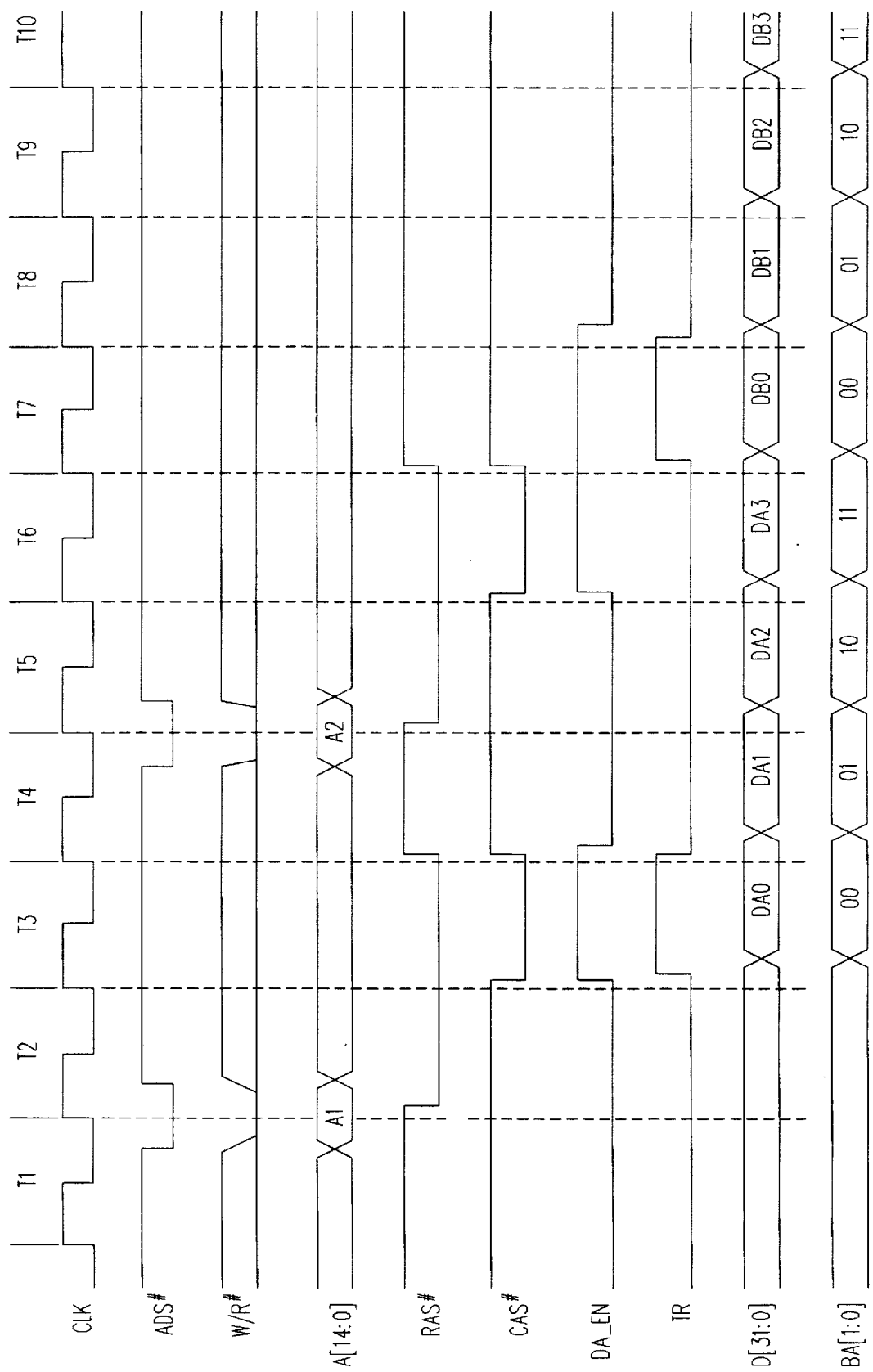
FIG. 6 is a timing diagram illustrating a pipeline-burst read operation in accordance with one embodiment of the invention.

FIG. 6 is a timing diagram illustrating a pipeline-burst read operation in accordance with one embodiment of the invention. PBDRAM system 100 is idle before cycle T1 of the clock signal CLK. During cycle T1, both the ADS# and W/R# signals are asserted low, and a first read address signal A1[14:0] is driven on the address bus by the microprocessor accessing memory system 100. At the rising edge of clock cycle T2, memory control sequencer 104 and write/read buffer control circuit 106 detect the arrival of a new read transaction. As previously described in connection with FIGS. 2 and 3, the logic low ADS# signal activates the memory control sequencer 104 and causes the RAS# signal to be asserted low. The logic low ADS# and W/R# signals cause the first read address A1[14:2] to be latched in the address latch circuit 107 and provided to address decoder 109. As previously discussed, the logic low RAS# signal causes the appropriate memory bank to be selected in response to address bits A1[14:13] and the appropriate word line to be turned on in response to address bits A1[12:5]. By turning on the word line, the memory cells in the selected row are connected to their respective bit lines.

At the falling edge of cycle T2, the sense-amplifiers in the selected bank are turned on in response to a sense amplifier enable signal generated by memory operation control circuit 105, thereby amplifying the signals on the bit lines. At the rising edge of cycle T3, the CAS# signal is asserted low by memory control sequencer 104. The logic low CAS# signal causes the column switches selected by the address signals A1[4:2] to turn on, thereby connecting selected sense amplifiers to the data amplifier circuit 201 in read buffer 102.

The logic low CAS# signal also causes write/read buffer control circuit 106 to drive the DA_EN signal to a logic high state, thereby activating the regenerative latches within data amplifier circuit 201. The four data values DA0, DA1, DA2 and DA3 required for the entire read burst transaction are thereby prefetched to data amplifier circuit 201 of read buffer 102. Write/read buffer control circuit 106 also drives the transfer enable signal TR to a logic high state in response to the logic low CAS# signal, thereby latching the data values DA0, DA1, DA2 and DA3 into transparent latch circuit 202.

Burst address sequencer 108 latches address sequence bits A1[1:0] in response to the ADS# signal. Upon receiving the logic high transfer enable signal TR, the burst address sequencer 108 generates a BA[1:0] signal. The BA[1:0] has an initial value which is dependent upon the value of address sequence bits A1[1:0]. Moreover, burst access control signal BA[1:0] sequentially transitions according to a predesignated sequence (e.g., a linear sequence or an x86 sequence) defined by address sequence bits A1[1:0]. In the described embodiment, the BA[1:0] signal has an initial value of 00 and transitions in a linear sequence from "00" to "01" to "10" to "11" in synchronism with the rising edges of the CLK signal. The BA[1:0] signal is provided to first multiplexer 203, thereby causing the data value D0 to be routed from transparent latch circuit 202 to I/O device 101 through multiplexer 203 during clock cycle T3. Data value DA0 is provided through multiplexer 203 to I/O device 101 without delay as soon as the transfer enable signal TR is asserted high. During subsequent clock cycles T4, T5 and T6, the burst address sequencer 108 generates BA[1:0] signals having predesignated values (e.g., 01, 10 and 11, respectively), which are determined by the address sequence bits A1[1:0]. As a result, the data values DA1, DA2 and DA3 are routed from transparent latch circuit 202 to I/O device 101 through multiplexer 203 during clock cycles T3, T4 and T5, respectively.

An additional control signal ADV# can be added to control the advancing of the burst access signal BA[1:0]. In such an embodiment, the burst access signal BA[1:0] is not advanced unless the ADV# signal is asserted. The rising edge of clock cycle T4 causes the RAS# and CAS# signals to transition to logic high states as previously discussed in connection with FIGS. 2 and 3. Also in response to the rising edge of clock cycle T4, write/read buffer control circuit 106 causes the transfer enable signal TR to transition to a logic low state, thereby isolating transparent latch circuit 202 from data amplifier circuit 201. Shortly after the transfer enable signal TR transitions to a logic low state, write/read buffer control circuit 106 causes the DA_EN signal to transition to a logic low state, thereby precharging the data amplifiers in data amplifier circuit 201.

During clock cycle T4, memory operation control circuit 105 performs a precharge operation on the selected memory bank by turning off the column select switches, turning off the word line driver circuit, turning off the sense amplifier circuit, and precharging the bit lines.

Because the memory cycle time is three clock cycles, a subsequent pipeline read transaction can be initiated during clock cycle T4 by transmitting a logic low ADS# signal, a logic low W/R# signal, and a second address signal A2[14:0] from I/O device 101. This pipeline read transaction is detected at the beginning of clock cycle T5. The RAS# signal again goes low at the rising edge of clock cycle T5, initiating another RAS cycle within memory system 100. The CAS# signal again goes low at the rising edge of clock cycle T6, thereby causing write/read buffer control circuit 106 to assert a logic high DA_EN signal during clock cycle T6. A second set of four data values DB0, DB1, DB2 and DB3 is thus stored in data amplifier circuit 201 during clock cycle T6. Note that the transfer enable signal TR is not asserted during clock cycle T6, such that the data values DA0, DA1, DA2 and DA3, which were stored in transparent latch circuit 202 during the first read transaction, are not disturbed. Only after the last data value DA3 has been read out from transparent latch circuit 202 does the write/read buffer control circuit 106 assert a logic high transfer enable signal TR. The write/read buffer control circuit 106 determines that the last data value DA3 has been read out of transparent latch circuit 202 by monitoring a burst access start signal BST which is generated by the burst address sequencer 108 at the start of each burst transaction. After the transfer enable signal TR has been asserted high, data values DB0, DB1, DB2 and DB3, of the second (pipeline) read transaction, are available to be provided to I/O circuit 101.

Burst address sequencer 108 latches address sequence bits A2[1:0] in response to the ADS# signal at the rising edge of clock cycle T5. Upon receiving the logic high transfer enable signal TR at the rising edge of clock cycle T7, the burst address sequencer 108 generates the BA[1:0] signal in response to the address sequence bits A2[1:0] as previously described and asserts a logic high BST signal to signal the beginning of a new burst sequence. In the described embodiment, the BA[1:0] signal again has an initial value of 00 and transitions in a linear sequence from "00" to "01" to "10" to "11" in synchronism with the rising edges of the CLK signal. The BA[1:0] signal is provided to first multiplexer 203, thereby causing the data values DB0, DB1, DB2 and DB3 to be routed from transparent latch circuit 202 to I/O device 101 through multiplexer 203 during clock cycles T7, T8, T9 and T10, respectively. Data value DB0 is provided through multiplexer 203 to I/O device 101 without delay as soon as the transfer enable signal TR is asserted high during clock cycle T7. The pipeline burst read data transfer is therefore gap-less, with data values being provided to I/O device 101 during each of clock cycles T3–T10. Importantly, the address of each read transaction can be anywhere within the address space spanned by the memory system 100.

In a variation of the previously described sequence, the pipeline read transaction is modified to interrupt the data burst of the first read transaction. In such a variation, write/read buffer control circuit 106 asserts a logic high transfer enable signal TR at the rising edge of clock cycle T6. As a result, the first data value DB0 of the second (pipeline) read transaction will overwrite the last data value DA3 of the first read transaction during clock cycle T6. The time at which a current read transaction can be interrupted by a subsequent read transaction is determined mainly by the memory cycle time. When the memory cycle time is equal to 3 clock cycles, a new transaction can be initiated every 3 clock cycles without over-running the memory.

Figure 7:
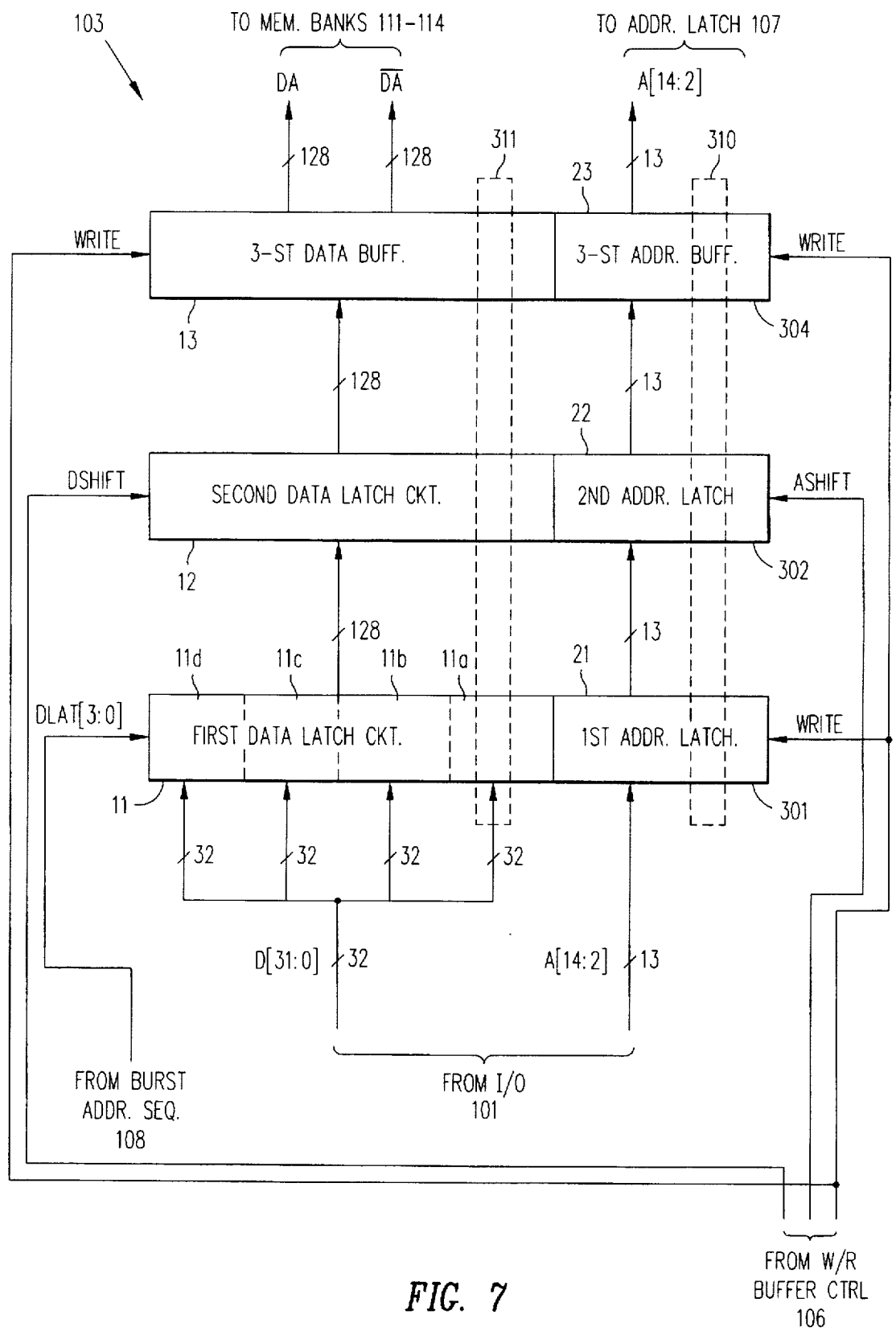
FIG. 7 is a block diagram of a write buffer in accordance with one embodiment of the invention.

FIG. 7 is a block diagram of write buffer 103, which includes first latch circuit 301, second latch circuit 302 and tri-state buffer circuit 304. First latch circuit 301 includes a 128-bit wide first data latch 11 and a 13-bit wide first address latch 21. Similarly, second latch circuit 302 includes a 128-bit wide second data latch 12 and a 13-bit wide second address latch 22. Tri-state buffer circuit 304 includes 128 tri-state data buffers 13 and 13 tri-state address buffers 23.

First data latch 11 is partitioned into four registers 11a, 11b, 11c and 11d, with each register storing 32-bits. Each of these four registers 11a–11d is connected in parallel to receive the data value D[31:0] from the data bus. First data latch 11 also receives a 4-bit data latch signal DLAT[3:0] from burst address sequencer 108. Each of the four bits of the DLAT[3:0] signal activates a corresponding one of the four registers 11a–11d, thereby latching the data value D[31:0] into the activated register.

First address latch 21 is also connected to receive address signals A[14:2] from I/O device 101. Address signals A[14:2] are latched into first address latch 21 in response to a WRITE signal received from write/read buffer control circuit 106.

Second data latch 12 is coupled to receive the four 32-bit words stored in the first data latch 11. The contents of the first data latch 11 are latched into the second data latch 12 in response to a data shift (DSHIFT) signal received from write/read buffer control circuit 106. Second address latch 22 is connected to receive address signals A[14:2] stored in the first address latch 21. The contents of the first address latch 21 are latched into the second address latch 22 in response to an address shift (ASHIFT) signal received from write/read buffer control circuit 106.

The tri-state data buffers 13 are connected to receive the contents of second data latch 12, and the tri-state address buffers 23 are connected to receive the contents of second address latch 22. The contents of the second data latch 12 and the second address latch 22 are routed through the tri-state data buffers 13 and the tri-state address buffers 23, respectively, in response to the WRITE signal provided by the write/read buffer control circuit 106.

The first and second data latches 11 and 12 each have the capacity to store all of the data values required for a burst of four 32-bit data values. Address buffers 21 and 22 store the addresses corresponding to the data values stored in data buffers 11 and 12, respectively. The first and second latch circuits 301 and 302 are configured to form a 2-deep first in, first out (FIFO) memory. The first data latch 11 is dedicated for storing data values of a current write transaction, while the second data latch 12 is dedicated for storing data values of a previous write transaction which are currently being retired to a selected one of memory banks 111–114.

Figures 8, 9:
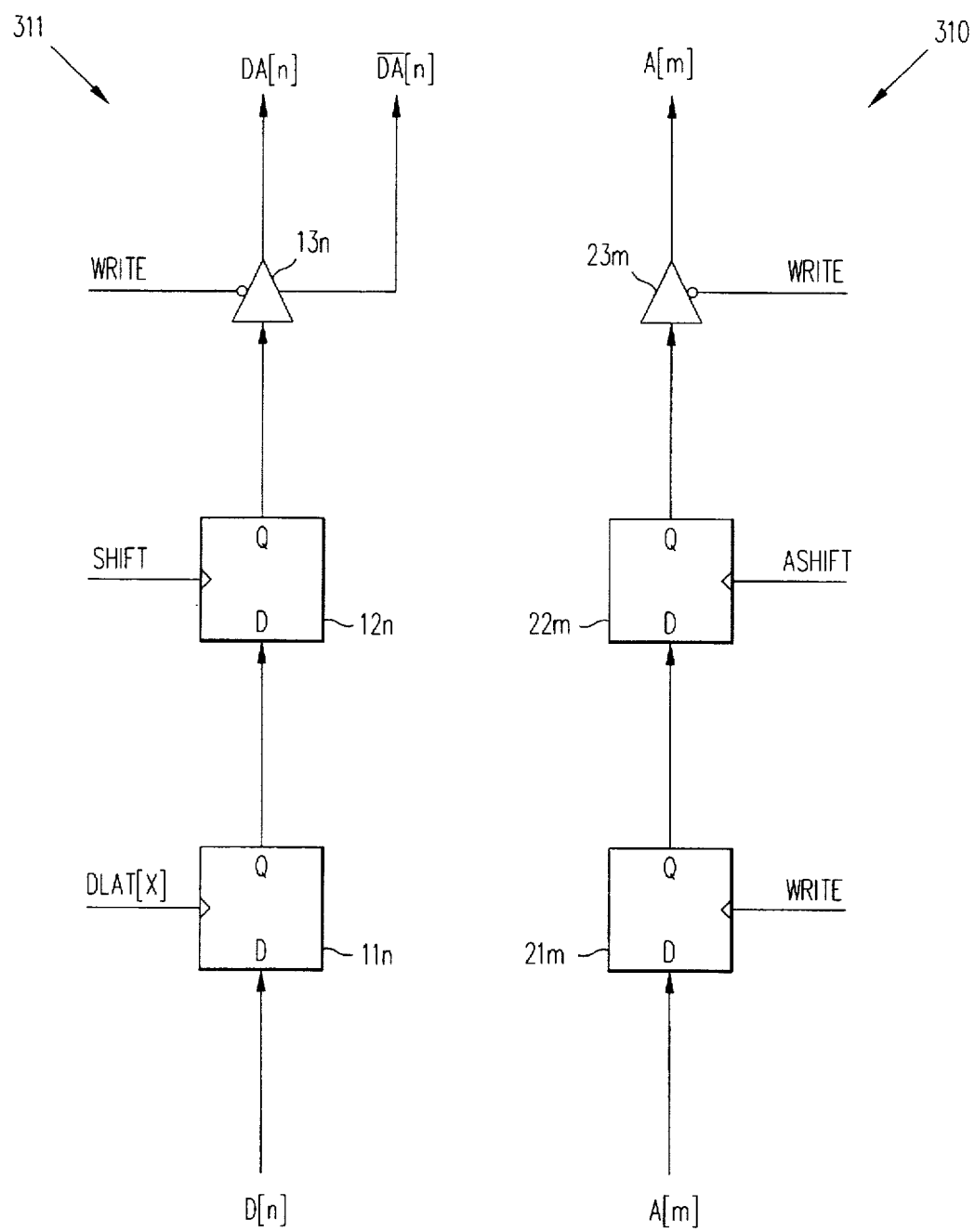
FIG. 8 is a schematic diagram of a bit-slice of a data path within the write buffer of FIG. 7.
FIG. 9 is a schematic diagram of a bit-slice of an address path within the write buffer of FIG. 7.

FIG. 8 is a schematic diagram of the nth bit-slice 311 of first data latch 11, second data latch 12 and tri-state data buffer 13. Bit-slice 311 includes a data latch 11n and a data latch 12n which are connected in cascade to form a two-bit shift register. Data latch 11n is coupled to receive data bit D[n] of data value D[31:0] and data latch signal DLAT[x]. Data latch signal DLAT[x] is one of the four DLAT[3:0] signals. Of the 128 data latches in first data latch 11, the 32 data latches which form register 11a are connected to receive DLAT[0], the 32 data latches which form register 11b are connected to receive DLAT[1], the 32 data latches which form register 11c are connected to receive DLAT[2] and the 32 data latches which form register 11d are connected to receive DLAT[3]. When the DLAT[x] signal is asserted high, data bit D[n] is latched into first data latch 11n.

Data latch 12n is coupled to receive data bit D[n] from data latch 11n. Data latch 12n latches in data bit D[n] when the DSHIFT signal is asserted high. Tri-state buffer 13n is coupled to receive data bit D[n] from data latch 12n. When the WRITE signal is asserted high, tri-state buffer 13n transmits the data bit D[n] as data signal DA[n] and transmits the inverse of data bit D[n] as data signal $\overline{DA}$[n] to memory banks 111–114.

FIG. 9 is a schematic diagram of the mth bit-slice 312 of first address latch 21, second address latch 22 and tri-state address buffer 23. Bit-slice 312 includes an address latch 21m and an address latch 22m which are connected in cascade to form a two-bit shift register. Address latch 21m is coupled to receive address bit A[m] and the WRITE signal. When the WRITE signal is asserted high, address bit A[m] is latched into address latch 21m.

Address latch 22m is coupled to receive address bit A[m] from address latch 21m. Address latch 22m latches in address bit A[m] when the ASHIFT signal is asserted high.

Tri-state buffer 23m is coupled to receive address bit A[m] from address latch 22m. When the WRITE signal is asserted high, tri-state buffer 23m transmits the address bit A[m] to address decoder 109.

Figure 10:
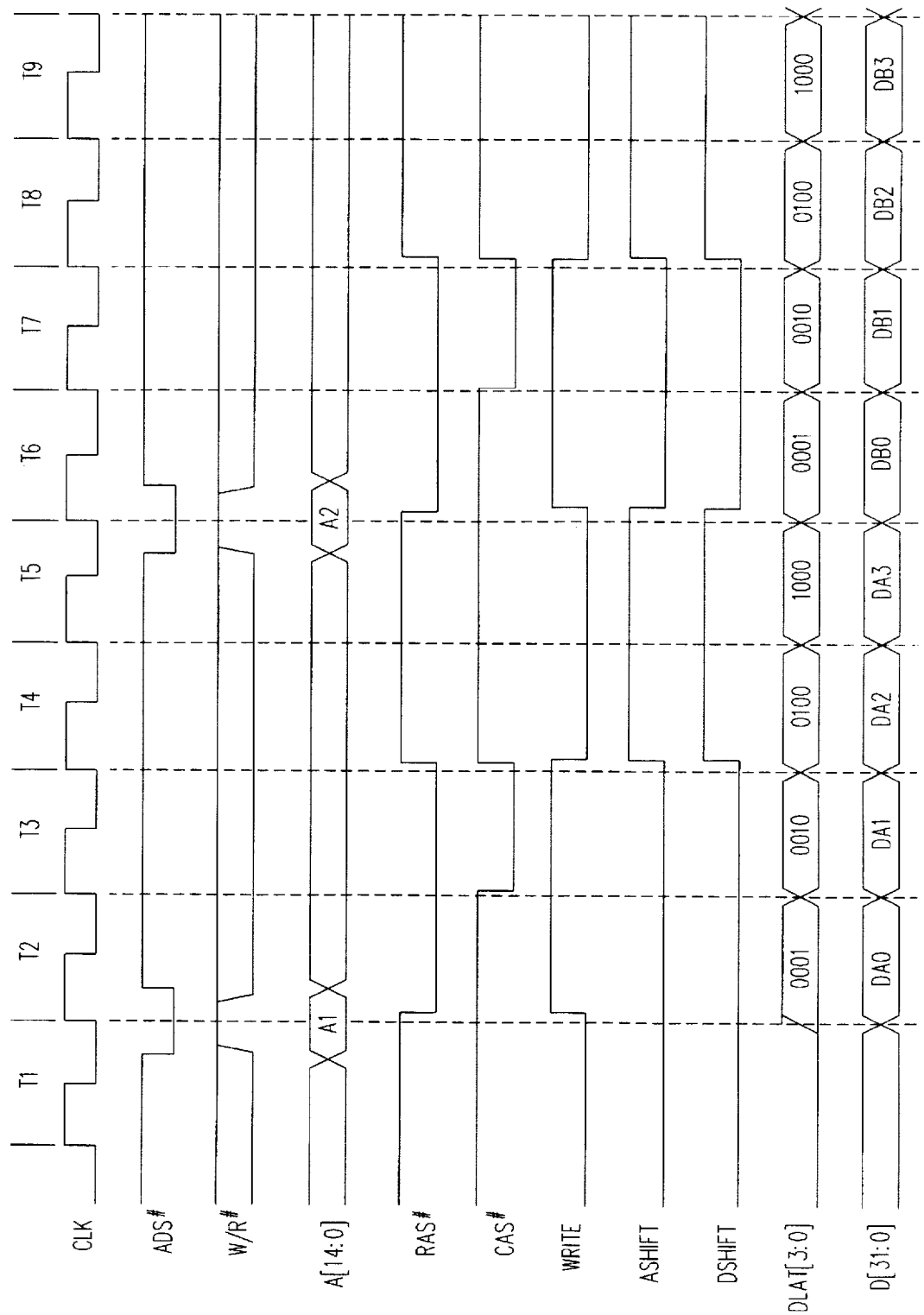
FIG. 10 is a timing diagram illustrating a pipeline burst write operation in accordance with one embodiment of the invention.

FIG. 10 is a timing diagram illustrating a pipeline burst write operation in accordance with one embodiment of the invention. Memory system 100 is in an idle state before cycle T1 of clock signal CLK. During clock cycle T1, a microprocessor (not shown) coupled to I/O device 101 begins a first write transaction by driving a first memory address A1[14:0] onto the address bus, driving the W/R# signal to a logic high state, driving the ADS# signal to a logic low state and driving a first data signal DA0[31:0] onto the data bus 117. These signals are buffered by I/O device 101. Memory control sequencer 104 detects the write transaction at the rising edge of clock cycle T2 in the manner previously described in connection with FIGS. 2 and 3.

In response to the logic low ADS# signal, the memory control sequencer 104 generates a logic low RAS# signal. The logic low RAS# signal, in turn, causes the write/read buffer control circuit 106 to generate a logic high WRITE signal. This logic high WRITE signal is provided to the first address latch 21, thereby causing the first address signal A1[14:2] to be written to first address latch 21.

Burst address sequencer 108 latches address sequence bits A1[1:0] in response to the ADS# signal. Upon receiving the logic high WRITE signal, the burst address sequencer 108 generates a DLAT[3:0] signal. The DLAT[3:0] has an initial value which is dependent upon the value of address sequence bits A1[1:0]. In the described embodiment, the DLAT[3:0] signal has an initial value of 0001. This DLAT [3:0] signal is provided to first data latch 11, thereby causing the data value DA0[31:0] to be written to the first register 11a within first data latch 11 during clock cycle T2. During subsequent clock cycles T3, T4 and T5, the I/O device 101 drives second, third and fourth data signals DA1[31:0], DA2[3:0] and DA3[3:0], respectively, onto the data bus 117. During clock cycles T3, T4 and T5, burst address sequencer 108 generates DLAT[3:0] signals having predesignated values (e.g., 0010, 0100 and 1000, respectively), which are determined by the address sequence bits A1[1:0]. As a result, the data values DA1[31:0], DA2[3:0] and DA3[3:0] are written to corresponding registers (e.g., registers 11b, 11c and 11d, respectively), within first data latch 11 during clock cycles T3, T4 and T5.

Meanwhile, memory control sequencer 104 causes the CAS# signal to be asserted low at the rising edge of clock cycle T3. At the rising edge of clock cycle T4, memory control sequencer 104 causes the RAS# and CAS# signals to be de-asserted high. In response to the de-asserted RAS# and CAS# signals, the write/read buffer control circuit 106 de-asserts the WRITE signal low. The low WRITE signal turns off tri-state buffer circuit 310, thereby isolating the selected memory bank from write buffer 103.

Also in response to the logic high RAS# and CAS# signals, the write/read buffer control circuit 106 asserts logic high ASHIFT and DSHIFT signals. The ASHIFT and DSHIFT signals remain asserted until the next write transaction is initiated (i.e., until write/read buffer control circuit receives another logic low RAS# signal). The logic high DSHIFT signal is applied to second data latch 12, thereby causing the data values DA0, DA1, DA2 and DA3 to be latched into second data latch 12. The logic high ASHIFT signal is applied to the second address latch 22, thereby causing the first address signals A1[14:2] to be latched into second address latch 22.

The first set of data values DA0, DA1, DA2 and DA3 is not written to the memory array 115 during the first write transaction. Rather, the first set of data values is stored in the second latch circuit 302 until the second write transaction is initiated. When the second write transaction is initiated, the first set of data values is written to the memory array 115 as described below.

During clock cycle T5, the microprocessor coupled to I/O device 101 begins a second write transaction by driving a second memory address A2[14:0] onto the address bus, driving the W/R# signal to a logic high state, driving the ADS# signal to a logic low state and driving the data signal DB0[31:0] onto the data bus 117. Again, I/O device 101 buffers these signals. Memory control sequencer 104 detects the write transaction at the rising edge of clock cycle T6 in the manner previously described in connection with FIGS. 2 and 3. In response to the logic low ADS# signal, the memory control sequencer 104 generates a logic low RAS# signal. The logic low RAS# signal further causes write/read buffer control circuit 106 to generate a logic high WRITE signal. This logic high WRITE signal is provided to the first address latch 21, thereby causing a second address signal A2[14:2] to be written to first address latch 21. The logic high WRITE signal also causes tri-state data buffer 13 to pass data values DA0, DA1, DA2 and DA3 from second data latch 12 to memory banks 111–114. The logic high WRITE signal further causes tri-state address buffer 23 to pass the first address signal A1[14:2] is latched into address decoder 109 by the logic low RAS# signal. In response, address decoder 109 enables the selected memory bank and word line.

Burst address sequencer 108 latches address sequence bits A2[1:0] in response to the ADS# signal. In response to the logic high WRITE signal, the burst address sequencer 108 sequentially generates DLAT[3:0] signals having values depending on the values of A[1:0] and the predesignated burst sequence. These DLAT[3:0] signals are provided to first data latch 11, along with data values DB0, DB1, DB2 and DB3, thereby causing data values DB0, DB1, DB2 and DB3 to be written to corresponding registers 11a, 11b, 11c and 11d of first data latch 11 during clock cycles T6, T7, T8 and T9, respectively.

Memory control sequencer 104 causes the CAS# signal to be asserted low at the rising edge of clock cycle T7. In response, the selected memory bank enters a CAS cycle. The logic low CAS# signal causes selected column switches to turn on. As a result, the data values DA0, DA1, DA2 and DA3 are written to the address identified by address signal A1[14:2].

Memory control sequencer 104 causes the RAS# and CAS# signals to be de-asserted high at the rising edge of clock cycle T8. In response, the write/read buffer control circuit 106 de-asserts the WRITE signal and asserts logic high DSHIFT and ASHIFT signals. The logic low WRITE signal turns off tri-state buffer circuit 310, thereby isolating the memory array 115 from write buffer 103. At this time, memory array goes through the precharge operation as previously described. The DSHIFT and ASHIFT signals remain asserted until the next write transaction is initiated (i.e., until write/read buffer control circuit receives another logic low RAS# signal).

The logic high DSHIFT signal is applied to second data latch 12, thereby causing the data values DB0, DB1, DB2 and DB3 to be latched into second data latch 12. The logic high ASHIFT signal is applied to the second address latch 22, thereby causing the address A2[14:2] to be latched in address latch 22. The second set of data values DB0, DB1, DB2 and DB3 and the second address A2[14:2] are therefore stored for when the third write transaction is initiated.

Thus, during the second write transaction, the first set of data values DA0, DA1, DA2 and DA3 are retired to the memory array, while the second set of data values DB0, DB1, DB2 and DB3 and the second address A2[14:2] are latched into second latch circuit 302. Consequently, the data pipeline burst transfer can be gap-less, with data values being written to memory device 100 during each clock cycle. Importantly, the address of each write transaction can be anywhere within the address space spanned by the memory system 100.

The previous description has described a first burst read operation pipelined with a second burst read operation. The previous description has also described a first burst write operation pipelined with a second burst write operation. However, memory system 100 also facilitates a burst read operation pipelined with a subsequent burst write operation, and (2) a burst write operation pipelined with a subsequent burst read operation.

Figure 11:
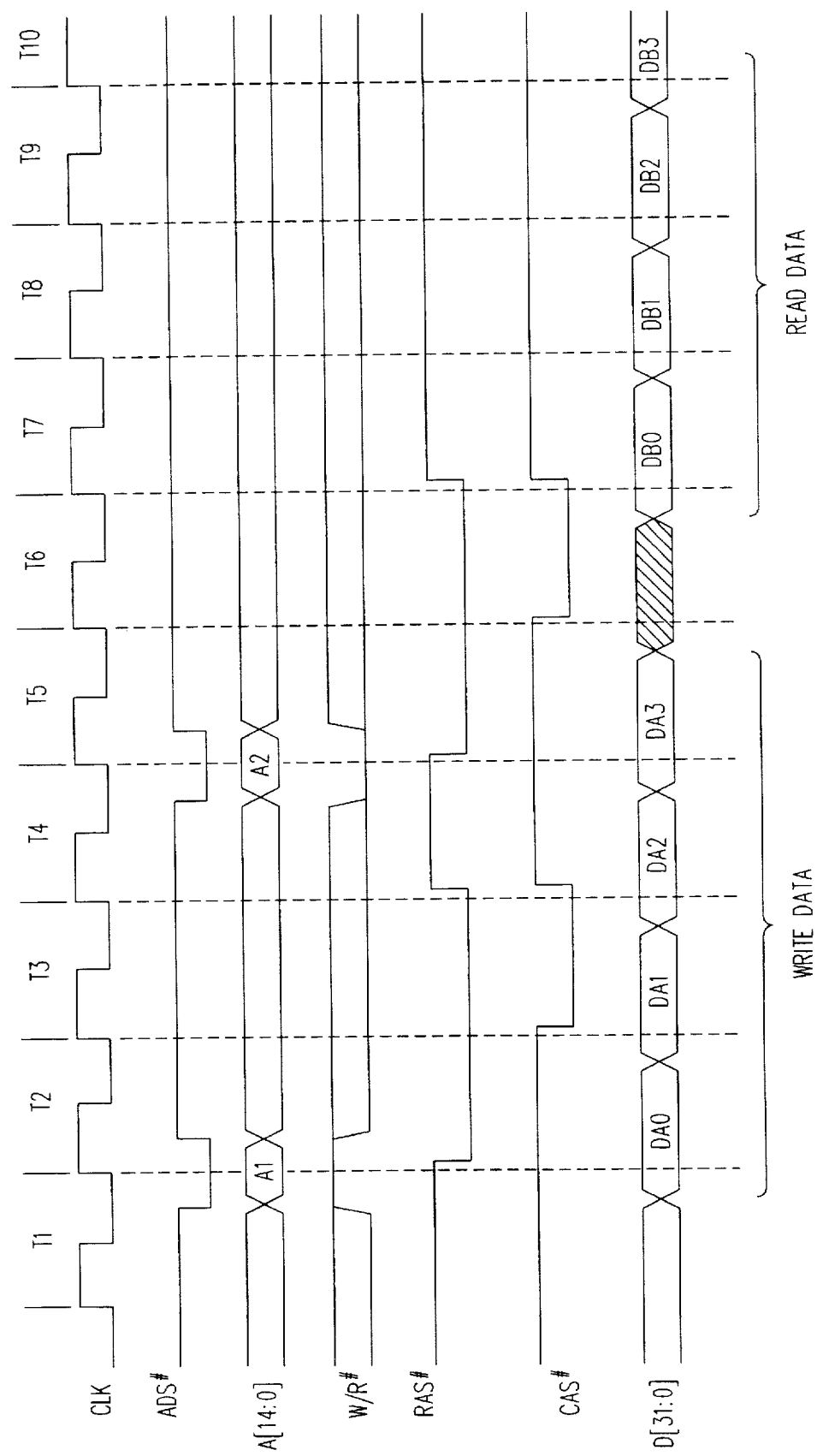
FIG. 11 is a timing diagram illustrating a burst write operation followed by a burst read operation.

FIG. 11 is a timing diagram illustrating a burst write operation followed by a burst read operation. The burst write operation is initiated at the rising edge of clock cycle T2 and proceeds as previously described in connection with FIG. 10. Not all of the waveforms associated with this burst write operation are shown in FIG. 11, as these waveforms were previously discussed in connection with FIG. 10. The burst read operation is initiated at the rising edge of clock cycle T5 and proceeds as previously described in connection with FIG. 6. Not all of the waveforms associated with this burst read operation are shown in FIG. 11, as these waveforms were previously discussed in connection with FIG. 6. Because the burst read operation is initiated during the burst write transaction, the dead time between the burst write and burst read transactions is minimized to one clock cycle. This dead clock cycle enables the direction of data flow on the data bus to be reversed for the burst read operation.

Figure 12:
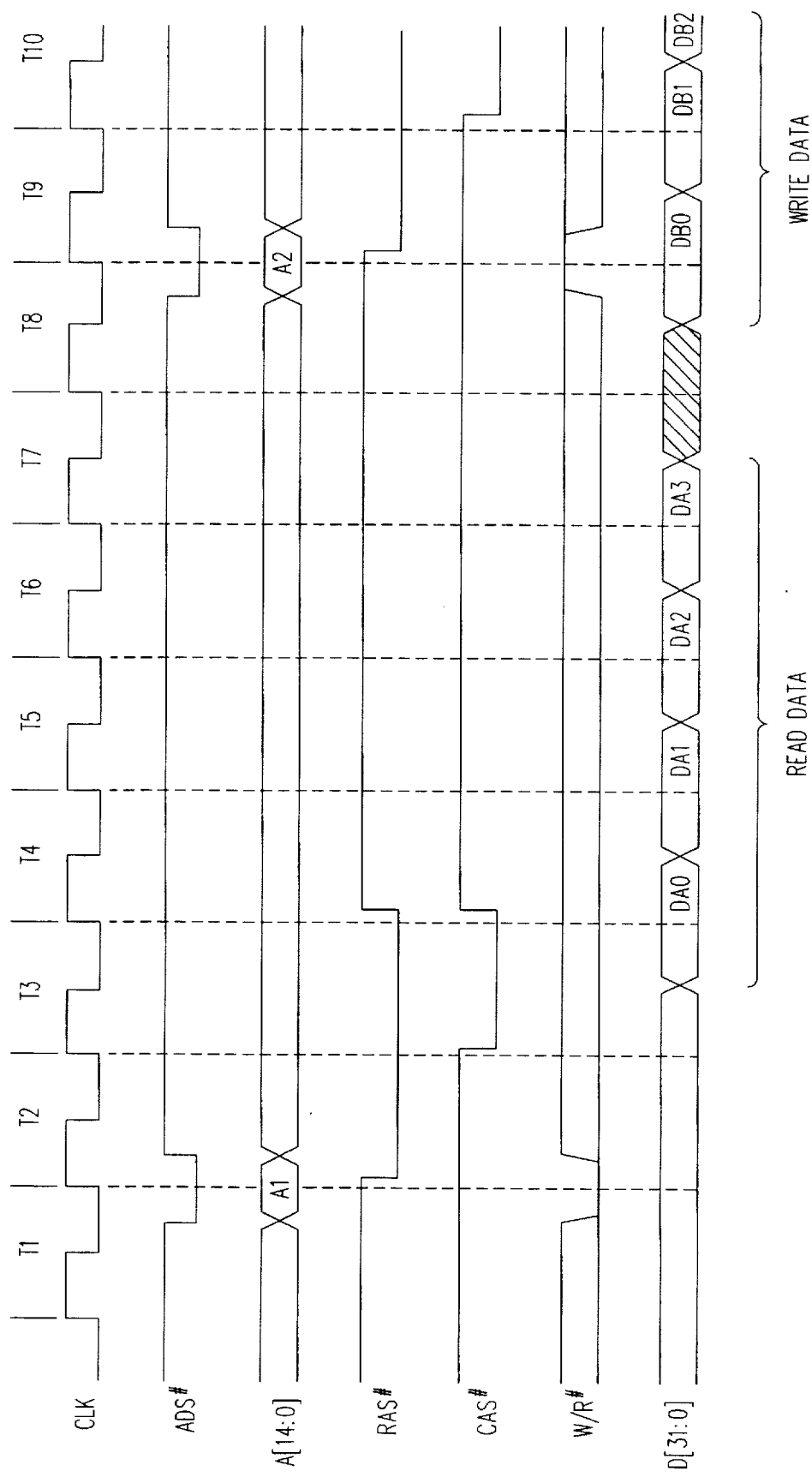
FIG. 12 is a timing diagram illustrating a burst read operation followed by a burst write operation.

FIG. 12 is a timing diagram illustrating a burst read operation followed by a burst write operation. The burst read operation is initiated at the rising edge of clock cycle T2 and proceeds as previously described in connection with FIG. 6. Not all of the waveforms associated with this burst write operation are shown in FIG. 12, as these waveforms were previously discussed in connection with FIG. 6. The burst write operation is initiated at the rising edge of clock cycle T9 and proceeds as previously described in connection with FIG. 10. Not all of the waveforms associated with this burst write operation are shown in FIG. 12, as these waveforms were previously discussed in connection with FIG. 10. The burst write transaction is not initiated until the rising edge of clock cycle T9 to provide a dead clock cycle between the burst read and burst write transactions. This dead clock cycle enables the direction of data flow on the data bus to be reversed for the burst write operation.

Although the invention has been described in connection with several embodiments, it is understood that this invention is not limited to the embodiments disclosed, but is capable of various modifications which would be apparent to one of ordinary skill in the art. For example, although the present invention is described as using DRAM cells, in other embodiments other memory technologies, such as Flash EPROM or SRAM can be used. Thus, the invention is limited only by the following claims.

What is claimed is:

1. A memory system comprising:

a memory array having a memory cycle time and an input/output (I/O) cycle time, wherein the memory cycle time is longer than the I/O cycle time; and a pipeline-burst access circuit coupled to the memory array, wherein the pipeline-burst access circuit enables pipeline-burst read operations or pipeline-burst write operations to be performed with the same access latency across the entire address range of the memory array;

wherein the pipeline-burst access circuit comprises a read buffer to the memory array, wherein the read buffer stores a set of data values for an entire burst read sequence; and wherein the read buffer comprises;

a first data storage circuit coupled to the memory array; and a second data storage circuit coupled to the first data storage circuit, wherein the first and second data storage circuits are cascaded to form a double buffer circuit; and wherein the pipeline-burst access circuit further comprises a read buffer control circuit coupled to the read buffer, the read buffer control circuit generating a first control signal which causes the set of data values to be stored in the first data storage circuit during a first clock cycle.

2. The memory system of claim 1, wherein the read buffer control circuit further generates a second control signal which causes the set of data values to be stored in the second data storage circuit during the first clock cycle.

3. The memory control system of claim 2, wherein the second control signal causes second data storage circuit to be isolated from the first data storage circuit during a second clock cycle.

4. The memory system of claim 1, wherein the first data storage circuit comprises a plurality of data amplifiers.

5. The memory system of claim 1, wherein the second data storage circuit comprises a plurality of transparent latches.

6. The memory system of claim 1, wherein the read buffer further comprises a multiplexer coupled to the second data storage circuit.

7. The memory system of claim 6, further comprising a sequencer circuit coupled to the multiplexer, wherein the sequencer circuit generates control signals which cause the multiplexer to sequentially route the set of data values from the second data storage circuit.

8. The memory system of claim 1, wherein the memory cycle time is three times the I/O cycle time.

9. The memory system of claim 1, wherein the pipeline-burst access circuit comprises a write buffer coupled to the memory array, wherein the write buffer stores a set of data values for an entire burst write sequence.

10. The memory system of claim 9, wherein the write buffer comprises:

an input/output (I/O) device coupled to receive write data and write addresses;

a first data storage circuit coupled to receive write data from the I/O device;

a first address storage circuit coupled to receive write addresses from the I/O device;

a second data storage circuit coupled to the first data storage circuit, wherein the first and second data storage circuits are cascaded to form a first double buffer circuit;

a second address storage circuit coupled to the first address storage circuit, wherein the first and second address storage units are cascaded to form a second double buffer circuit; and a tri-state buffer circuit coupled between the second data storage circuit and the memory array, the tri-state buffer circuit also being coupled between the second address storage circuit and the memory array.

11. The memory system of claim 10, wherein the pipeline-burst access circuit further comprises a write buffer control circuit coupled to the write buffer, the write buffer control circuit generating a first control signal which places the tri-state buffer circuit in a conductive state, thereby providing a first set of data values stored in the second data storage circuit and a first address value stored in the second address storage circuit to the memory array during a first clock cycle, the first control signal further causing a second address value to be stored in the first address storage circuit during the first clock cycle.

12. The memory system of claim 11, further comprising a sequencer circuit which generates a second control signal which is applied to the first data storage circuit to cause a second set of data values to be sequentially written to the first data storage circuit over a plurality of clock cycles.

13. The memory system of claim 12, wherein the write buffer control circuit further generates a third control signal which is applied to the second data storage circuit and the second address storage circuit, wherein the third control signal causes the second set of data values to be written to the second data storage circuit and causes the second address value to be written to the second address storage circuit during a second clock cycle.

14. The memory system of claim 13, wherein the first control signal causes second data storage circuit and the second address storage circuit to be isolated from the memory array during the second clock cycle.

15. The memory system of claim 9, wherein the write buffer comprises a two entry buffer configured to route information in a first in, first out (FIFO) manner.

16. The memory system of claim 15, wherein each entry of the two entry buffer comprises a data buffer for storing data values for a full burst write operation and an address buffer for storing the memory address of the data values in the data buffer.

17. The memory system of claim 15, wherein the write buffer further comprises a plurality of shift registers.

18. A memory system comprises:

a memory array having a memory cycle time and an input/output (I/O) cycle time, wherein the memory cycle time is longer than the I/O cycle time; and a pipeline-burst access circuit coupled to the memory array, wherein the pipeline-burst access circuit enables pipeline-burst read operations or pipeline-burst write operations to be performed with the same access latency across the entire address range of the memory array;

wherein the pipeline-burst access circuit comprises a write buffer coupled to the memory array, wherein the write buffer stores a set of data values for an entire burst write sequence;

wherein the write buffer is controlled to transfer a plurality of data values to the memory array simultaneously.

19. A memory system comprising:

a dynamic random access memory (DRAM); and a memory control sequencer for accessing the DRAM, wherein the memory control sequencer generates a row access signal and a column access signal for controlling the memory operations of the DRAM in response to a single external access signal and a clock signal;

wherein the memory control sequencer comprises circuitry for detecting the reception of the external access signal during a first cycle of the clock signal, asserting the row access signal during the first cycle and a consecutive second cycle of the clock signal, asserting the column access signal during the second cycle of the clock signal, de-asserting the row and column access signals during a consecutive third cycle of the clock signal, and precharging the DRAM during the third cycle of the clock signal.

20. A memory system comprises:

a dynamic random access memory (DRAM); and a memory control sequencer for accessing the DRAM wherein, the memory control sequencer generates, a row access signal and a column access signal for controlling the memory operations of the DRAM in response to an external access signal and a clock signal;

wherein the memory control sequencer comprises circuitry for blocking the external access signal for three clock cycles upon detecting the external access signal.

21. A method of operating a memory array having a memory cycle time and an input/output (I/O) cycle time, wherein the memory cycle time is longer than the I/O cycle time, the method comprising the steps of:

initiating a read access to the memory array during a first clock cycle;

reading a first set of data values from the memory array during a second clock cycle;

storing the first set of data values read from the memory array in a first data storage circuit during the second clock cycle;

storing the first set of data values in a second data storage circuit during the second clock cycle, wherein the second data storage circuit is cascaded with the first data storage circuit; and then isolating the second data storage circuit from the first data storage circuit during a third clock cycle.

22. The method of claim 21, further comprising the step of precharging the memory array during the third clock cycle.

23. The method of claim 22, further comprising the steps of:

initiating a second read access to the memory array during a fourth clock cycle;

reading a second set of data values from the memory array during a fifth clock cycle;

storing the second set of data values read from the memory array in the first data storage circuit during the fifth clock cycle; and reading data values of the first set of data values out of the second data storage circuit during the second, third, and fourth clock cycles.

24. The method of claim 23, further comprising the steps of:

reading a data value of the first set of data values out of the second data storage circuit during the fifth clock cycle;

storing the second set of data values in the second data storage circuit during the sixth clock cycle; and then isolating the second data storage circuit from the first data storage circuit during a seventh clock cycle.

25. The method of claim 21, further comprising the steps of:

performing a row access operation on the memory array during the first clock cycle;

performing a column access operation on the memory array during the second clock cycle, thereby reading the first set of data values from the memory array.

26. The method of claim 21, further comprising the steps of:

sequentially reading the first set of data values from the second data storage circuit; and initiating a write access of the memory array one clock cycle after the first set of data values have been read from the second data storage circuit.

27. A method of operating a memory array having a memory cycle time and an input/output (I/O) cycle time, wherein the memory cycle time is longer than the I/O cycle time, the method comprising the steps of:

storing a first set of data values in a first data storage circuit during a first write transaction;

storing a first address corresponding to the first set of data values in a first address storage circuit during the first write transaction;

shifting the first set of data values from the first data storage circuit to a second data storage circuit during the first write transaction;

shifting the first address from the first address storage circuit to a second address storage circuit during the first write transaction;

providing the first set of data values and the first address to the memory array during a second write transaction, whereby the first set of data values are written to the memory array during a single clock cycle;

storing a second set of data values in the first data storage circuit during the second write transaction;

storing a second address corresponding to the second set of data values in the first address storage circuit during the second write transaction;

shifting the second set of data values from the first data storage circuit to a second data storage circuit after the first set of data values has been provided to the memory array; and shifting the second address from the first address storage circuit to a second address storage circuit after the first address has been provided to the memory array.

28. The method of claim 27, further comprising the steps of:

initiating a read access of the memory array during the second write transaction; and reading data values from the memory array one clock cycle after storing the second set of data values in the first data storage circuit.

* * * * *